(12) United States Patent
Chen et al.

(10) Patent No.: US 7,764,068 B2
(45) Date of Patent: Jul. 27, 2010

(54) TEST BOARD FOR TESTING PCBS

(75) Inventors: Yue-Wen Chen, Taipei Hsien (TW); Han-Chieh Chang, Taipei Hsien (TW); Chien-Chun Chen, Taipei Hsien (TW)

(73) Assignees: Foxnum Technology Co., Ltd., Tucheng, Taipei County (TW); Hon Hai Precision Industry Co., Ltd., Tu-Cheng, Taipei Hsien (TW)

( * ) Notice: Subject to any disclaimer, the term of this patent is extended or adjusted under 35 U.S.C. 154(b) by 296 days.

(21) Appl. No.: 11/963,876

(22) Filed: Dec. 24, 2007

(65) Prior Publication Data

US 2009/0108851 A1      Apr. 30, 2009

(30) Foreign Application Priority Data

Oct. 24, 2007    (CN) .................. 2007 1 0202241

(51) Int. Cl.
   *G01R 31/28* (2006.01)
(52) U.S. Cl. ...................................... 324/555
(58) Field of Classification Search ............... 324/555, 324/761, 765, 158.1
   See application file for complete search history.

(56) References Cited

U.S. PATENT DOCUMENTS

| 5,157,326 A | * | 10/1992 | Burnsides | .................. 324/537 |
| 5,652,524 A | * | 7/1997 | Jennion et al. | .............. 324/765 |
| 7,405,573 B2 | * | 7/2008 | Cuevas | ...................... 324/539 |

* cited by examiner

*Primary Examiner*—Vincent Q Nguyen
(74) *Attorney, Agent, or Firm*—Frank R. Niranjan

(57) ABSTRACT

A test board for testing PCBs includes a plurality of signal input terminals, a plurality of signal output terminals connected to the signal input terminals respectively, a standby signal output terminal, and a plurality of switches. The standby signal output terminal is connected to the signal input terminals via the switches respectively.

9 Claims, 4 Drawing Sheets

TEST BOARD FOR TESTING PCBS

BACKGROUND OF THE INVENTION

1. Field of the Invention

The present invention relates to a test board for testing printed circuit boards (PCBs).

2. Description of Related Art

Referring to FIG. 1, a conventional test board for testing a PCB includes an input connector 10, and an output module 20. The input connector 10 is a 24-pin connector, and each pin acts as a signal input terminal. The output module 20 includes two groups of signal output terminals CN1 and CN2, and each group includes 12 signal output terminals. Each signal input terminal is connected to a corresponding signal output terminal.

In testing, transmission lines of the PCB to be tested are connected to the input connector 10, and are given an input signal, then each output of the output module 20 is checked to determine if the transmission lines are good.

If a line or a signal output terminal of the test board becomes inoperable, the whole test board should be replaced, which is costly.

What is needed, therefore, is an test board which can solve the above problem.

SUMMARY

An exemplary test board for testing PCBs includes a plurality of signal input terminals, a plurality of signal output terminals connected to the signal input terminals respectively, a standby signal output terminal, and a plurality of switches. The standby signal output terminal is connected to the signal input terminals via the switches respectively.

Other advantages and novel features will become more apparent from the following detailed description when taken in conjunction with the accompanying drawings, in which:

DETAILED DESCRIPTION

Figure 1:
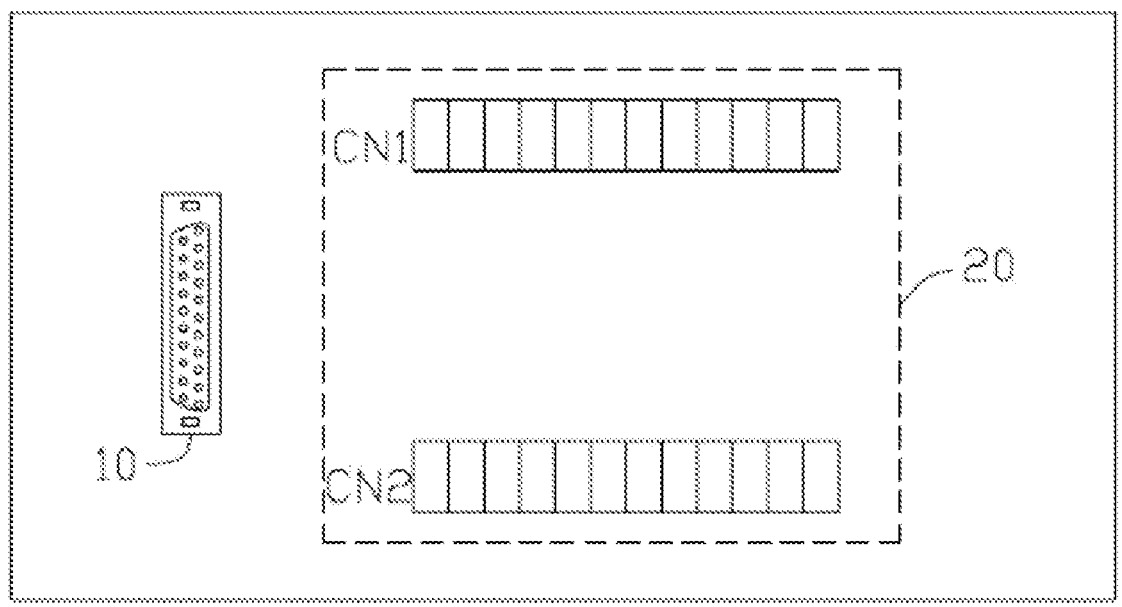
FIG. 1 is a schematic diagram of a conventional test board.
Figure 2:
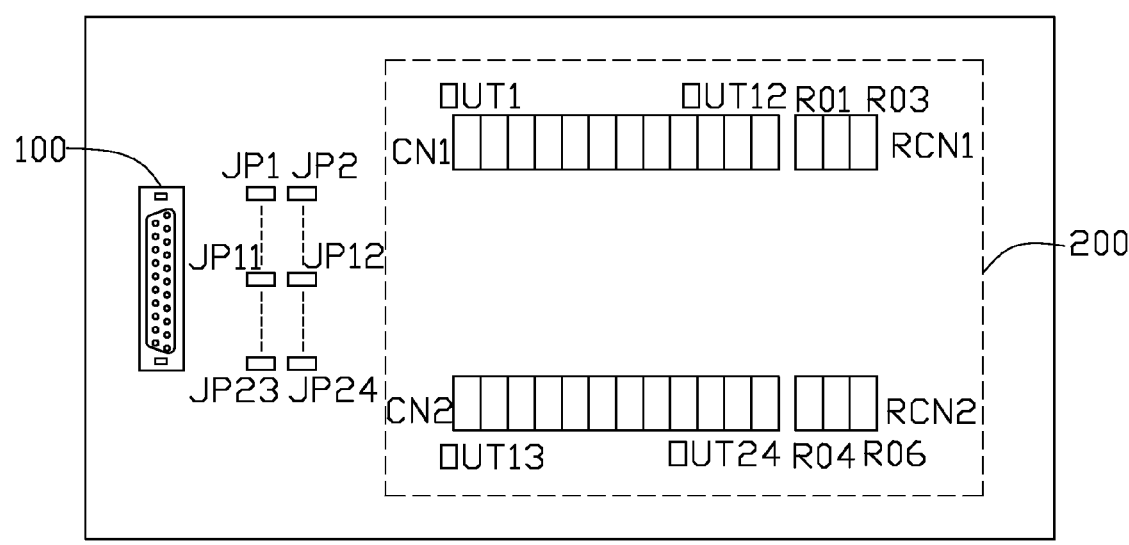
FIG. 2 is a schematic diagram of one embodiment of a test board for testing PCBs in accordance with the present invention.

Referring to FIG. 2, a test board for testing PCBs in accordance with an embodiment of the present invention includes an input connector 100, an output module 200, and 24 switches JP1-JP24. In this embodiment, the input connector 100 is a 24-pin connector which includes 24 signal input terminals IN1-IN24. The output module 200 includes two groups of signal output terminals CN1, CN2, and two groups of standby signal output terminals RCN1, RCN2. The group of signal output terminals CN1 includes 12 signal output terminals OUT1-OUT12, and the group of signal output terminals CN2 includes 12 signal output terminals OUT13-OUT24. The group of standby signal output terminals RCN1 includes 3 standby signal output terminals RO1-RO3, and the group of standby signal output terminals RCN2 includes 3 standby signal output terminals RO4-RO6.

Figure 3:
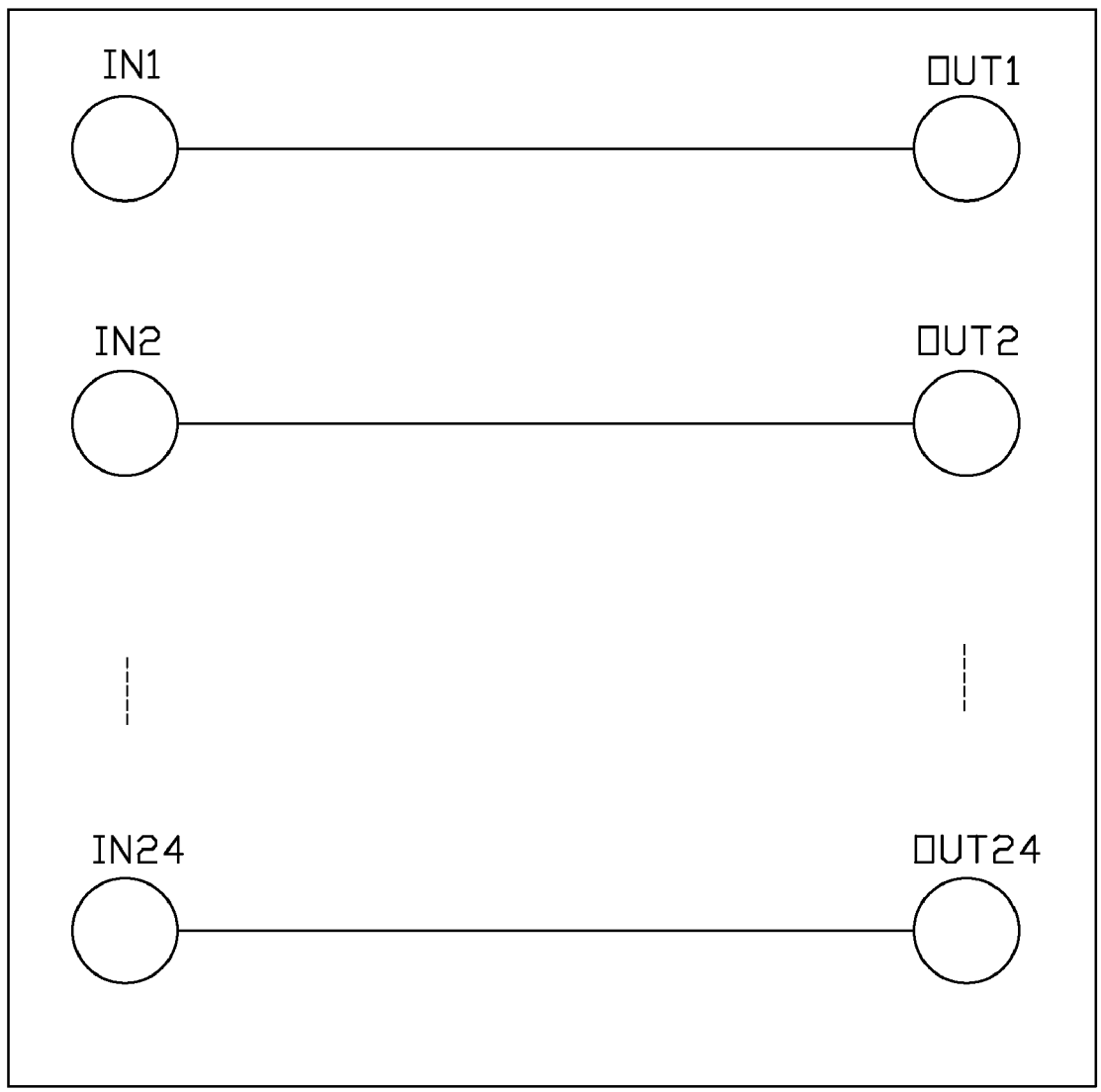
FIG. 3 is a circuit diagram of an upper layer of the test board for testing PCBs of FIG. 2.
Figure 4:
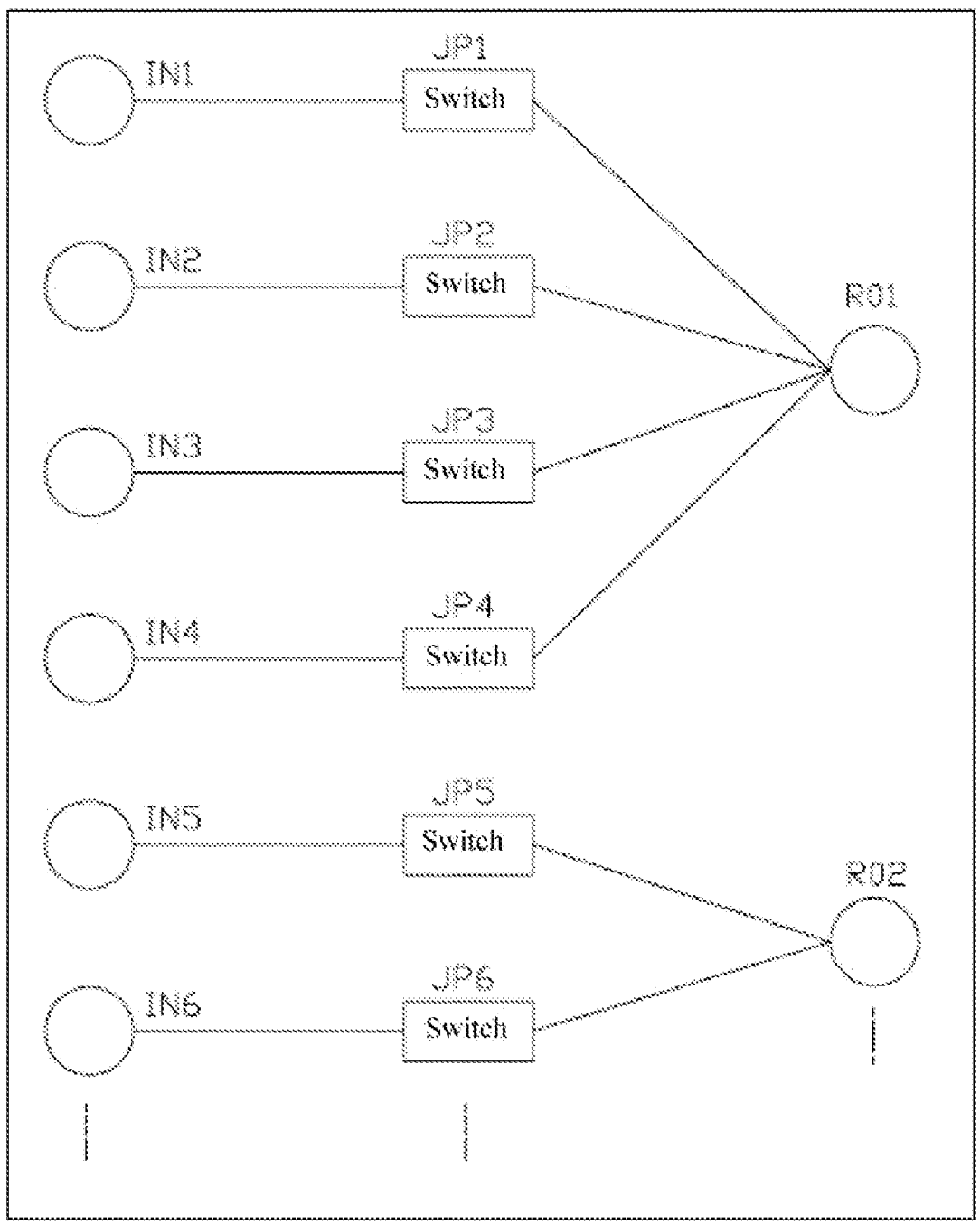
FIG. 4 is a circuit diagram of a lower layer of the test board for testing PCBs of FIG. 2.

Referring also to FIG. 3 and FIG. 4, the test board for testing PCBs includes an upper layer as shown in FIG. 3 and a lower layer as shown in FIG. 4. In the upper layer, the signal input terminals IN1-IN24 are connected to the signal output terminals OUT1-OUT24 respectively. In the lower layer, the standby signal output terminal RO1 is connected to the signal input terminals IN1-IN4 via the switches JP1-JP4 respectively. The standby signal output terminal RO2 is connected to the signal input terminals IN5-IN8 via the switches JP5-JP8 respectively, and so on, through to the standby signal output terminal RO6 being connected to the signal input terminals IN21-IN24 via the switches JP21-JP24 respectively.

Therefore, the standby signal output terminal RO1 can replace the signal input terminals IN1-IN4 by operation of the switches JP1-JP4. The standby signal output terminal RO2 can replace the signal input terminals IN5-IN8 by operating the switches JP5-JP8, and so on, through to the standby signal output terminal RO6 replacing the signal input terminals IN21-IN24 by operating the switches JP21-JP24. For example, if the signal output terminal OUT1 becomes inoperable, the standby signal output terminal RO1 can replace the signal input terminal IN1 by operating the switch JP1.

In this embodiment, the amounts of the signal input terminals, the signal output terminals, and the switches are 24 respectively. The amount of the standby signal output terminals is 6. The amount of the signal input terminals, the signal output terminals, the switches, or the standby signal output terminals is not limited to those of the embodiment.

The foregoing description of the exemplary embodiments of the invention has been presented only for the purposes of illustration and description and is not intended to be exhaustive or to limit the invention to the precise forms disclosed. Many modifications and variations are possible in light of the above teaching. The embodiments were chosen and described in order to explain the principles of the invention and their practical application so as to enable others skilled in the art to utilize the invention and various embodiments and with various modifications as are suited to the particular use contemplated. Alternately embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:

1. A test board for testing PCBs, the test board comprising:
   a plurality of signal input terminals;
   a plurality of signal output terminals connected to the signal input terminals respectively;
   a plurality of switches, and
   a standby signal output terminal, the standby signal output terminal connected to one of the plurality of signal input terminals via one of the plurality of switches correspondingly, to make the standby signal output terminal replace one of the plurality of signal output terminals corresponding to the connected signal input terminal in case that said one of the plurality of signal output terminals is broken.

2. The test board as claimed in claim 1, comprising an upper layer and a lower layer, transmitting lines between the signal input terminals and the signal output terminals are set in the upper layer; transmitting lines between the switches and the signal input terminals are set in the lower layer; transmitting lines between the switches and the standby signal output terminal are set in the lower layer.

3. The test board as claimed in claim 1, wherein the signal input terminals are pins of a connector.

4. A test board for testing PCBs, the test board comprising:
   M*N signal input terminals, wherein the M*N signal input terminals comprising N groups of terminals, each group comprises M terminals;
   M*N signal output terminals connected to the signal input terminals respectively;
   M*N switches; and
   N standby signal output terminals, each of the standby signal output terminals connected to one of the M signal input terminals via one of the M switches correspondingly, to make the standby signal output terminal replace one of the signal output terminals corresponding to the connected signal input terminal in case that said one of the plurality of signal output terminals is broken, N and M each being an integer greater than one.

5. The test board as claimed in claim 4, comprising an upper layer and a lower layer, transmitting lines between the signal input terminals and the signal output terminals are set in the upper layer; transmitting lines between the switches and the signal input terminals are set in the lower layer; transmitting lines between the switches and the standby signal output terminals are set in the lower layer.

6. The test board as claimed in claim 4, wherein the signal input terminals are pins of a connector.

7. A test board for testing PCBs, the test board comprising:
   a signal input terminal;
   a signal output terminal connected to the signal input terminal;
   a switch; and
   a standby signal output terminal, the standby signal output terminal connected to the signal input terminal via the switch, to make the standby signal output terminal replace the signal output terminal in case that the signal output terminal is broken.

8. The test board as claimed in claim 7, comprising an upper layer and a lower layer, a transmitting line between the signal input terminal and the signal output terminal is set in the upper layer; a transmitting line between the switch and the signal input terminal is set in the lower layer; a transmitting line between the switch and the standby signal output terminal is set in the lower layer.

9. The test board as claimed in claim 7, wherein the signal input terminal is a pin of a connector.

* * * * *